United States Patent [19]

Halstead et al.

[11] 4,128,807

[45] Dec. 5, 1978

[54] MULTI-DIAL ELECTRIC METER REGISTER

[75] Inventors: Kenneth G. Halstead; Thomas G. Willis, both of Raleigh, N.C.

[73] Assignee: Westinghouse Electric Corp., Pittsburgh, Pa.

[21] Appl. No.: 847,470

[22] Filed: Nov. 1, 1977

[51] Int. Cl.[2] ...................... G01R 15/08; G01R 11/64
[52] U.S. Cl. .................. 324/116; 324/103 R
[58] Field of Search ............................ 324/116, 103 R; 74/DIG. 7

[56] References Cited

U.S. PATENT DOCUMENTS 1,078,206  11/1913  Mayer ................................. 324/116
2,145,069  1/1939  Beusch et al. .................... 324/103 R

*Primary Examiner*—Gerard R. Strecker
*Assistant Examiner*—Ernest F. Karlsen
*Attorney, Agent, or Firm*—R. W. Smith

[57] ABSTRACT

A multi-dial meter register includes two energy consumption dial gear trains and a maximum power demand gear train that are selectively coupled to the meter movement of an electric utility billing meter. Two shifting control plates produce engagements and disengagements at input gears of the gear trains. A connecting shaft extends between the control plates and provides concurrent movement and further provides a dial status indicator at one end thereof.

12 Claims, 6 Drawing Figures

MULTI-DIAL ELECTRIC METER REGISTER

BACKGROUND OF THE INVENTION

1. Field of the Invention

This invention relates to multi-dial electric meter registers and more particularly to a combined dual rate electric energy and on-off maximum power demand register.

2. Description of the Prior Art

The mechanical dial registers of electric utility billing meters typically perform two general measuring functions, one being to totalize the rotations of a watthour meter movement and indicate, at dial pointers, the corresponding watthours of energy consumption. The other general measuring function is to only totalize the maximum number of rotations occurring during any one of successively occurring short-time intervals and to indicate the corresponding maximum watts of power demand. It is further known to selectively measure watthours or watt demand at so-called time of day or multi-rate registers so that energy consumption and/or power demands are separately indicated for different times of day or when consumption occurs above or below a predetermined rate or demand level. This permits different charges to be made for electric energy usage during on-peak and off-peak load conditions on an electric utility supply and distribution network.

Prior art electric meters are described in U.S. Pat. Nos. 671,272; 1,576,158; and 2,145,069 wherein energy consumption is measured either on a single register at different rates, as in the U.S. Pat. No. 671,272 or on two separate registers as in the latter two patents and the meters also measure power demand at an additional indicator. In each of aforementioned meter mechanisms, solenoid plungers actuate either a metering rate control resistor or a gear shift in a dual energy measuring register. An additional solenoid is associated with demand metering indicators in the U.S. Pat. Nos. 2,145,069 and 671,272.

Examples of time of day watthour registers are disclosed in U.S. Pat. Nos. 1,078,208; 2,000,736; 2,132,256; and 2,139,821. The aforementioned meter registers include two dials having associated gear trains. A watthour meter movement is connected to either of the dial gear trains under control of a clock mechanism to indicate on-peak and off-peak energy consumption. The latter two patents include pivotally mounted arms or plates for coupling a single driving gear to either of the two driven input gears providing separate inputs through the two dial gear trains. The aforementioned patents do not concurrently control a maximum demand register as in the present invention.

Examples of on-peak maximum demand registers are disclosed in U.S. Pat. Nos. 1,586,648 and 3,913,014; the latter being assigned to the assignee of this invention. These patents disclose a cam rotated by the demand gearing timing motor so that the maximum demand register is only engaged with the maximum demand indicators during daily on-peak periods.

Accordingly, it is desirable to have a simple and compact multi-dial meter register capable of providing selective on-peak and off-peak measurements of both electric energy consumption and maximum electric power demand.

SUMMARY OF THE INVENTION

In accordance with the present invention, a multi-dial register assembly for electric utility meters includes three sets of dials each associated with a different gear train having a driven input gear. First and second shifting control plates are pivotally mounted so that each moves between a first position and a second position. The gear train input gears are selectively coupled and uncoupled to a register drive gearing arrangement in response to the first and second position of the two control plates. A connecting member extends between the plates to produce concurrent movement of the control plate and to simultaneously provide a dial status indication.

Two energy consumption dial gear trains have the input gears thereof alternately coupled and uncoupled to one driving output gear of the register drive gearing. The first control plate moves parallel and adjacent to the two input gears of the energy dial gear trains and positions the driving gear for engaging either of two input gears. One end of the first control plate is moved by an electrical actuator remotely controlled by a clock mechanism. The other end of the control plate receives the connecting member so that a forward end thereof provides a dial status indicator that is viewable at a front dial plate of the register. A pair of locking members are also carried by the first control plate to enter the teeth of the undriven input gear to prevent erroneous changes in the associated dial reading. The rearward end of the connecting member extends through the second control plate and moves along a cam surface thereof as the control plates are concurrently moved between the first and second positions. The shaft of the input gear of the third and maximum power demand gear train is spring biased in a small slot of the second control plate. A second driving output gear of the register drive gearing is engaged with the demand input gear by the second position of the second control plate. A biasing spring urges the shaft of the demand input gear into meshing engagement with the driving gear.

These and other features and advantages of the present invention will be apparent on the detailed description of the drawings which are briefly described hereinafter.

DETAILED DESCRIPTION OF THE PREFERRED EMBODIMENT

Figure 1:
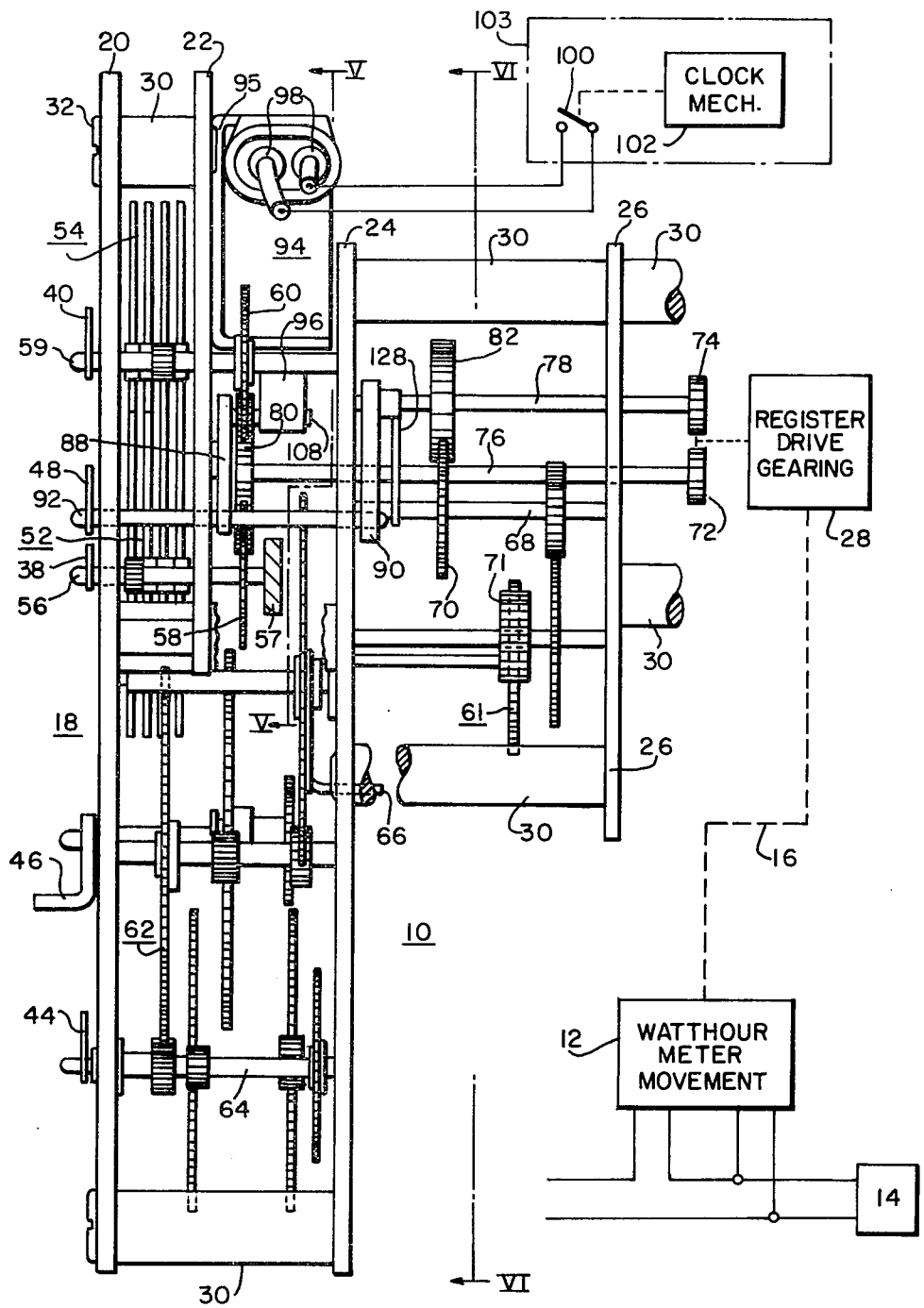
FIG. 1 is a diagrammatic view of an electric utility meter including a side elevation view of the multidial register assembly made in accordance with the present invention.

Referring now to the drawings and more particularly to FIG. 1, a diagrammatic view of an electric utility meter 10 of a well known type is shown therein having a watthour meter movement 12 having current end voltage sections responsive to the consumption of electric energy supplied to an electric load 14. As is well known, a watthour meter movement such as 12 includes a rotating shaft which as rotated at a rate corresponding to the rate of electrical consumption. The broken line 16 represents the rotational output of the meter movement 12 such as provided by a disc supporting shaft, not shown.

A side elevation view of a multi-dial register assembly 18 is shown in FIG. 1 as it is functionally connected to the watthour meter movement 12. The frame of the assembly 18 generally has a parallel series of gear shaft mounting plates including a dial plate 20, a front subplate 22, a middle plate 24, a rear subplate 26 and a back plate, not shown, having studs for detachably mounting the register assembly 18 to the watthour meter 10. When the register assembly is mounted a register drive gearing 28 is drivingly connected to the output 16 of the meter movement. The plates 20, 22, 24, 26 and the rear plate are held together by spacer studs 30 and screws 32 so that the assembly 18 forms an integral unit for the detachable mounting to the meter 10 and for carrying a plurality of gear supporting shafts as described hereinbelow.

Figure 2:
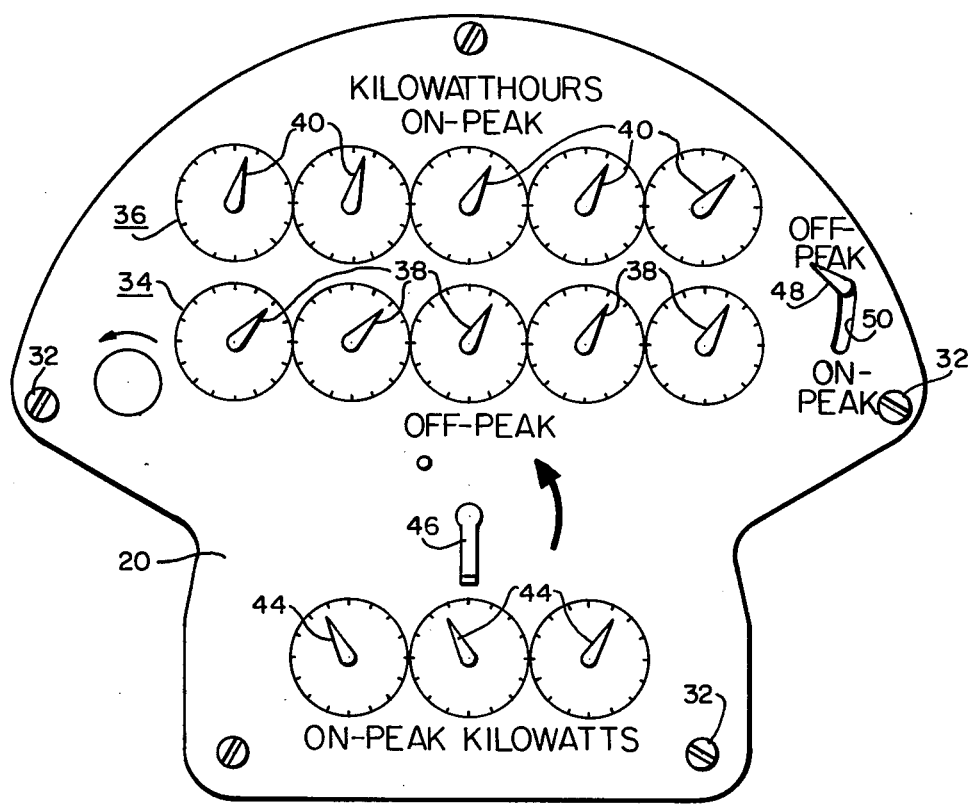
FIG. 2 is a front-elevational view of the register assembly shown in FIG. 1.

The face of the dial plate 20 is shown in FIG. 2 and is referred to now for a better understanding of the purpose of operation of the register assembly 18 described in detail hereinbelow. A first and middle dial 34 and a second and top dial 36 each include five plural order and decade related watthour consumption pointers 38 and 40, respectively. The first set of dials 34 is designated off-peak and the second set of dials 36 is designated on-peak for separately indicating the totalized metered electric energy consumption by the load 14 during different time periods which correspond to the electric utility company's off and on load demand time periods on its facilities.

The third and lower set of dials 42 includes three plural order and decade related maximum watt demand pointers 44. The set of dials 42 indicates the peak electric power usage of the load 14 during a given billing period only when such usage occurs during the on-peak periods. Typically the on-peak watthour consumption is billed at a higher rate than the off-peak watthour consumption. Accordingly, a penalty billing for maximum demand usage is only measured during the on-peak periods so as to further encourage consumers to shift higher rates of consumption of off-peak periods. A reset level 46 is provided for returning the pointers 44 to a zero or initial position at the end of each billing period in accordance with the conventional operation of watt demand registers.

The dial plate 20 further includes a dial status indicator 48 formed by a flag which slides between the upper and off-peak indicating position and a lower and on-peak indicating position along a slightly arcuate vertical slot 50 in the plate 20.

Referring now further to the dial register assembly 18 shown in FIG. 1, dial gear trains 52 and 54 are assembled between the dial plate 20 and plate 22 and include two sets of parallel and gear carrying pointer shafts carrying the pointers 38 and 40, respectively. The lowest order or most right hand pointer shaft 56 of the set of dials 34 extends through the dial plate 20 and extends to a mounting bracket 57 for carrying a driven input gear 58 of the dial gear train 52. The lowest order or most right hand pointer shaft 59, carrying a first of dial pointers 40 and included in the dial gear train 54, extends through the dial plate 20, the plate 22 to the middle plate 24. The shaft 59 carries a driven input gear 60 of the gear train 54 behind the plate 22 and in a common plane including the input gear 58. The selective engaged operations of the gears 58 and 60 are described further hereinbelow.

A maximum demand gear train 61 is only partially shown in FIG. 1 and includes a maximum demand dial indicating gear train 62 having three pointer shafts including lowest order shaft 64 for carrying the lowest or first of pointers 44. The maximum demand gear train 61 included in the register assembly 18 is generally of the type disclosed in U.S. Pat. Nos. 3,136,947; 3,406,338; 3,421,084; and 3,805,154 all assigned to the assignee of this invention and incorporated herein by reference. As described in the aforementioned patents the maximum demand gear train 61 includes a pushed member 66 which is driven during each demand interval in which the electrical energy consumption is higher than during any other demand interval to rotate the pointers 44 to the corresponding indications of kilowatts. A pusher member, not shown, is reset by a interval timing mechanism such as described in U.S. Pat. No. 3,805,154 so that the maximum demand gear train associated with the pusher member is intermittently connected to the rotational output 16 of the meter movement 12. Each demand interval has a time period, such as fifteen minutes, controlled by a synchronous motor, not shown, also described in the afore-mentioned patents. The reset lever 46 operates the maximum demand dial indicating gear train 62 to reset the pointers 44 also in accordance with the description of the afore-mentioned maximum demand register patents. A shaft 68 extending between the middle plate 24 and plate 26 carries a driven input gear 70 of the maximum demand gear train 61 having an operation which is accordance with the present invention and described further hereinbelow.

The register drive gearing 28 is mounted at the rear plate, not shown, of the register frame so as to be continuously driven by the output 16 of the meter movement 12. The drive gearing 28 includes gears 72 and 74 carried by two shafts 76 and 78, respectively. The rearward end, not shown, of the shaft 76 is pivotally mounted in the register rear plate and further carries one driving output gear 80 coplanar with the gears 58 and 60. The shaft 78 is rotationally mounted between the middle plate 24 and the register rear plate and further carries a second driving output gear 82. As described further hereinbelow, the driving gear 80 is selectively coupled to the dial register input gear 58 and 60 and the driving gear 82 is selectively coupled to and uncoupled from the maximum demand gear train input gear 70.

Figure 3:
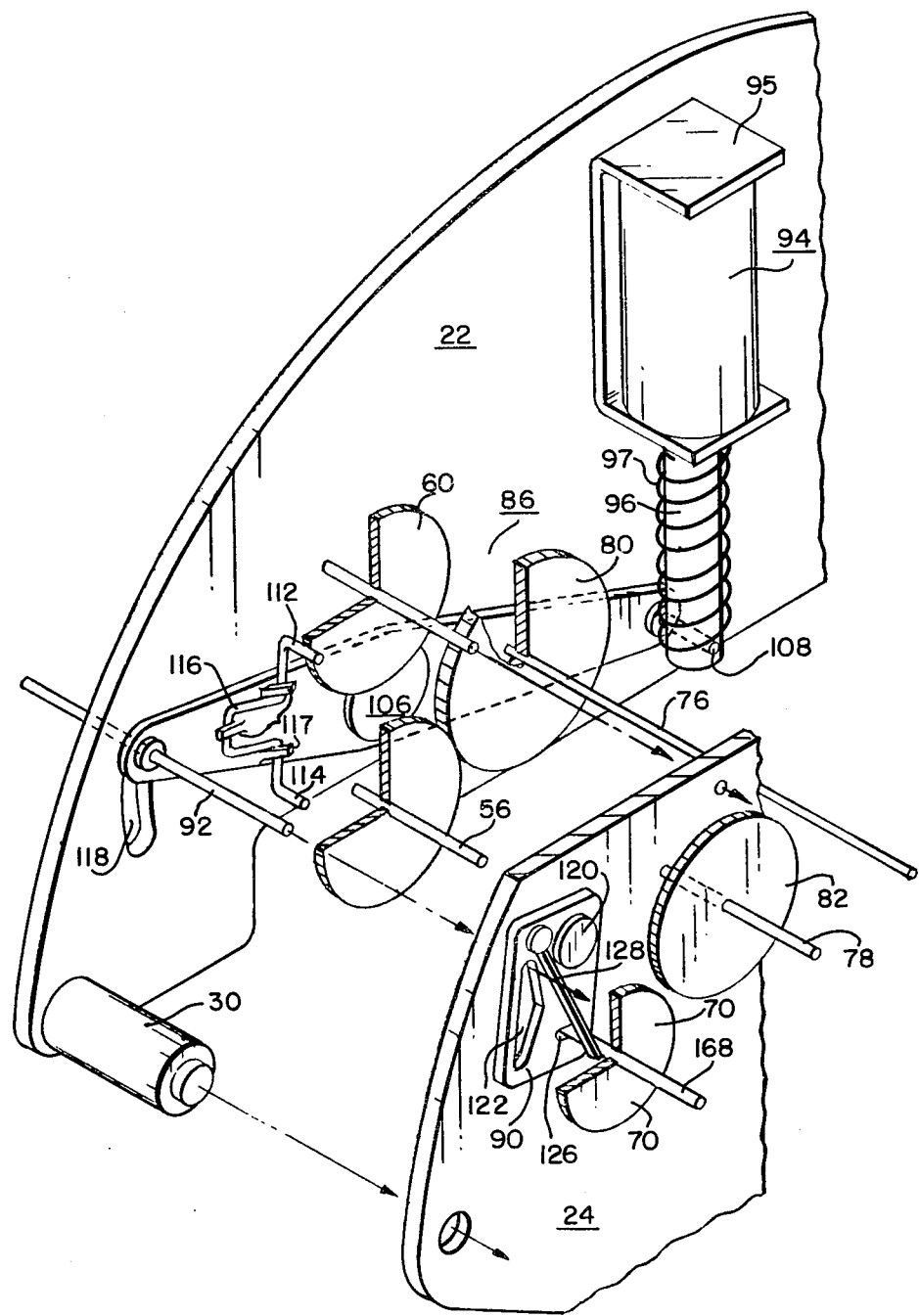
FIG. 3 is an exploded perspective view illustrating the portion of the register assembly of FIG. 1 including a gear shift mechanism in one mode of operation.
Figure 4:
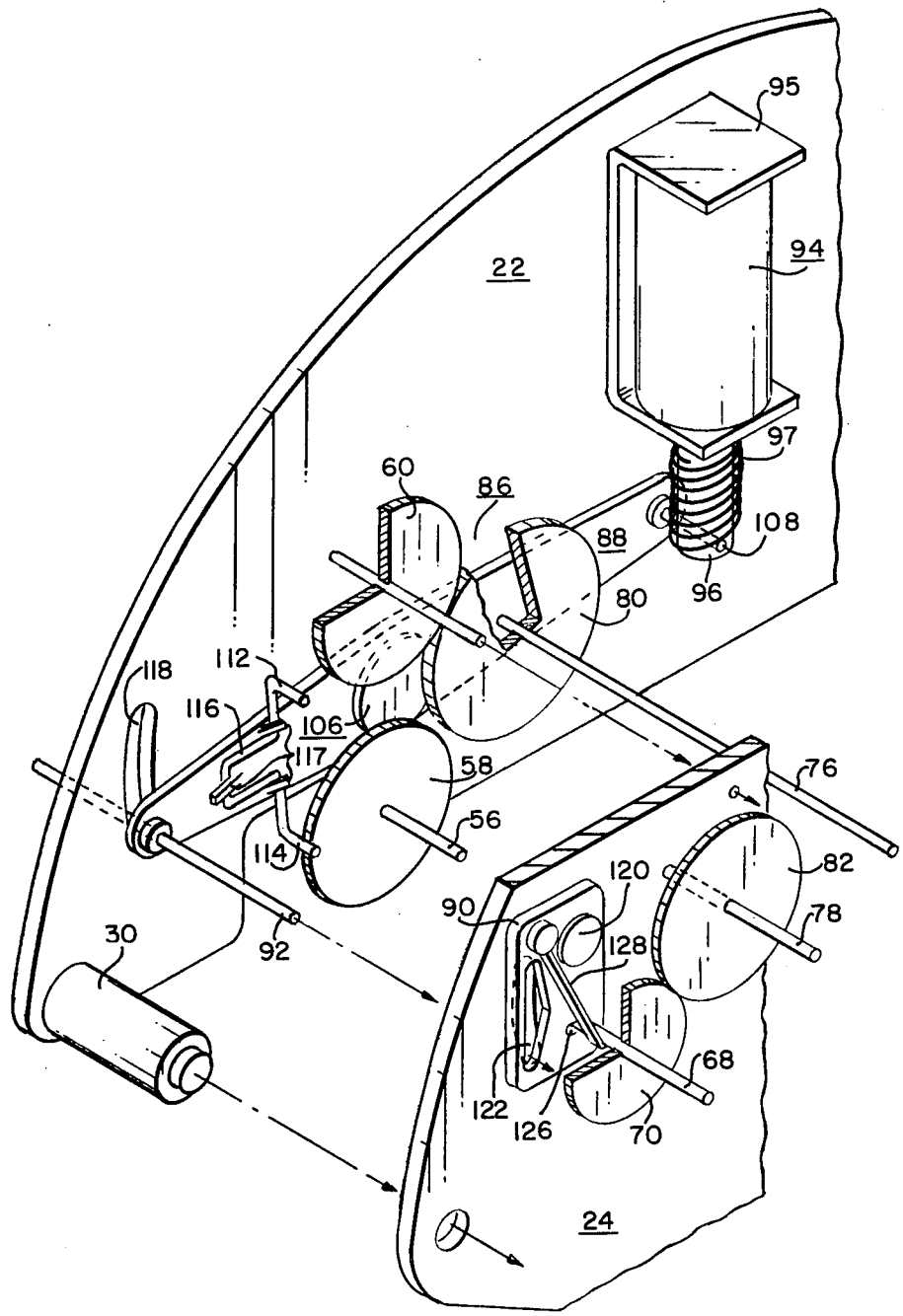
FIG. 4 is an exploded perspective view corresponding to FIG. 3 illustrating the gear shift mechanism in a second mode of operation.

Referring now to a gear shift mechanism 86 made in accordance with the present invention, the mechanism 86 has off-peak and on-peak modes of operation as shown in FIGS. 3 and 4 respectively. The principal parts of the gear shift mechanism 86 include first and second shifting control plates 88 and 90, a connecting number 92 extending between the plates 88 and 90 and an electrical actuator 94 compactly and simply arranged within the register assembly 18. The electrical actuator 94 is formed by a solenoid carried by a bracket 95 on the plate 22 and has a vertically reciprocally movable plunger 96 carrying a spring 97 that biases the plunger to a extended position when the solenoid is de-energized. The de-energized condition of the solenoid actuator 94 sets the gear shift mechanism 86 in the off-peak mode as shown in FIG. 3. The energized condition of the solenoid actuator 94 is shown in FIG. 4 wherein the retracted position of the plunger 96 as shown to effect the on-peak mode of operation of the gear shift mechanism 86 and register assembly 18. It is important that the de-energization of the actuator 94 places the register assembly in the off-peak mode so that any inoperative condition of the actuator will place the register in the lowest billing condition and not penalize the customer. A pair of solenoid lead terminals 98 are connected to a source of energization including a control switch 100 for supplying electrical power to the lead terminals, typically derived from the electric power being supplied to the load 14. A clock mechanism 102 controls the switch 100 and may include such a clock mechanism as disclosed in the aforementioned U.S. Pat. Nos. 2,132,256 and 2,139,821 with the exception that the clock mechanism 102 and associated switch 100 are included in a separate housing 103 mounted adjacent to the housing of the watthour meter 10 in a known manner. The clock switch control mechanism 102 is conventionally available. It is contemplated that the actuator 94 may be controlled from a more remote source such as by radio or power line carrier signals.

Figure 5:
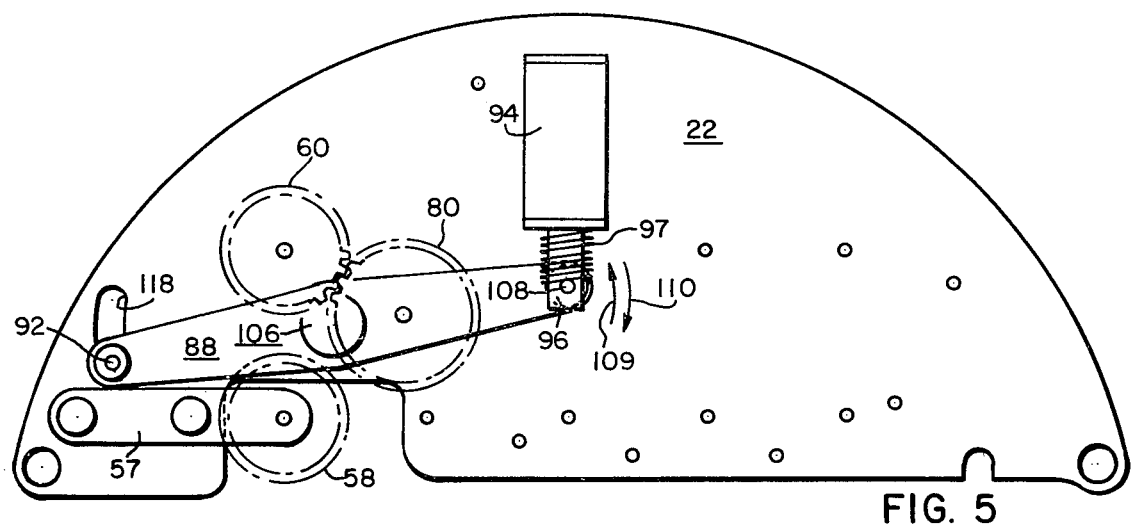
FIG. 5 is a cross-sectional view of FIG. 1 taken along the axis V—V and looking in the direction of the arrows with parts removed.

The first shifting control plate 88, more fully shown in FIGS. 3 and 4, is formed by a flat lever bar mounted to pivot about substantially the center thereof at a rivet 106. The positions of the plate 88 in FIGS. 3 and 4 are designated first and second, respectively. The rivet 106 pivotally connects the first control plate 88 to the rear side of the front subplate 22 also carrying the solenoid actuator 94. The right hand end of the control plate 88, as viewed in FIGS. 3, 4 and 5, is pivotally connected by means of a pin 108 for arcuate movement indicated by the directional arrows 109 and 110 of FIG. 5, indicating counterclockwise and clockwise movement as viewed from the rear. The upper and retracted position of the plunger 96 moves the right hand end of the control plate 88 to its uppermost and furthest limit of travel in the direction indicated by the arrow 109. The forward and movable end of the shaft 76, carrying the driving gear 80, is carried by the control plate 88 intermediate the rivet 106 and pin 108, as shown in FIGS. 3 and 4. The shaft 76 is thus slightly arcuately movable up and down so that the teeth of the gear 80 mesh with the upper input gear 60 of the dial gear train 54 when the plunger is in the retracted and on-peak or second position as shown in FIGS. 4 and 5.

The plate 88 further moves the gear 80 into meshing engagement with the lower input gear 58 of the dial gear train 52 when the solenoid actuator 94 is in the extended and off-peak de-energized condition as shown in FIG. 3. The plate 88 further carries a pair of detent or gear lock members 112 and 114 formed in bent wire 116 on the left hand side of the rivet 106. Integral tabs 117 of the plate 88 clamp the spring wire 116 in place when it is formed as shown in FIGS. 3 and 4 so as to terminate at the integral rearward projecting lock members 112 and 114. When the control plate 88 is positioned in the off-peak position, the gear lock member 112 engages the teeth of the input gear 60 so that the dial gear train 54 will not move while it is disengaged from the driving gear 80. The gear lock member 114 engages the input gear 58 when the plate 88 is moved to the on-peak position so that the dial gear train 52 will not move while the gear 58 is disengaged from the gear 80.

Figure 6:
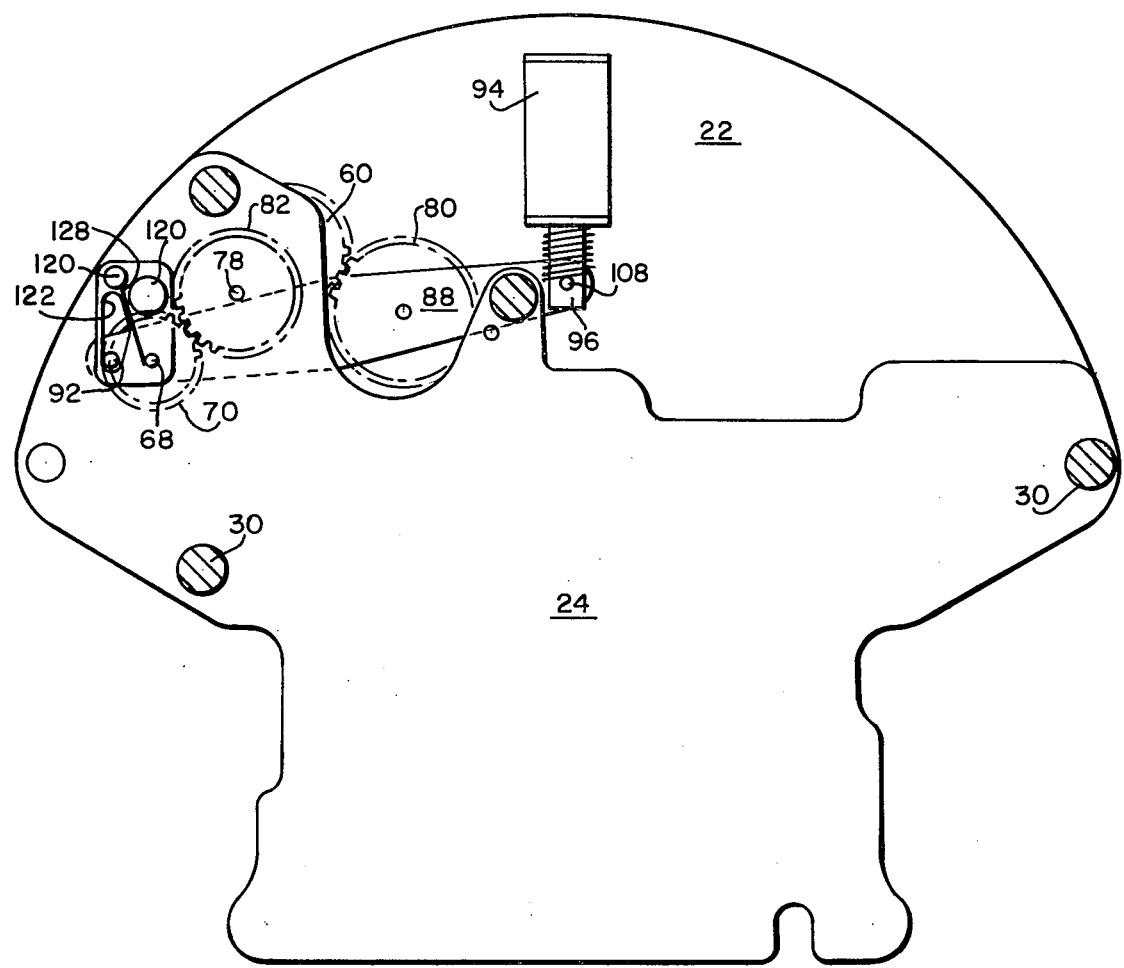
FIG. 6 is a cross-sectional view of FIG. 1 taken along the axis VI—VI and looking at the direction of the arrows with parts removed.

The left hand end of the control plate 88 as viewed in the rear views of FIGS. 3, 4, 5 and 6 carries a connecting member 116 which is formed by a straight rod or shaft extending from the plate 88 rearward through the second shifting control plate 90, as explained further hereinbelow, and extends forward through a slot 118 of the plate 22 and through the slot 50 of the plate 20 to carry the dial status indicator 48 forward of the dial plate 20 as shown in FIGS. 1 and 2. The control plates 88 and 90 extend substantially parallel to the register mounting plates 22 and 24 and the connecting member 116 extends substantially parallel to the gear supporting shafts of the register 18 and, therefore, transversely through the plates 88 and 90. Accordingly, when the solenoid plunger 96 is in the de-energized state so that the spring 97 biases it to the extended position, the connecting member 118 is rotated to its uppermost position as shown in FIGS. 2 and 3 to indicate that only the off-peak set of watthour dials 34 is being activated and are operating. When the solenoid actuator 96 is energized by the clock mechanism 102 and switch 100, the plunger 96 is retracted and the connecting member is in the lowermost position as shown in FIGS. 5 and 6. The indicator 48 is positioned to indicate the on-peak mode of operation. Thus, the indicator 48 designates that the on-peak watthour set of dials 36 and on-peak watt demand set of dials 42 are being activated and are operating.

The second shifting plate 90 is pivotally connected by means of a rivet 120 to the rear of the middle register frame plate 24. A generally isosceles triangular cam slot 122 is formed in the control plate 90 as shown in FIGS. 3, 4 and 6. The base side of the triangular cam slot extends generally vertically and adjacent the left hand side of the plate 90 as viewed from the rear. The top slot corner is generally aligned with the pivot axis of the plate at the center of the rivet 120. The first angular side extends downwardly and away from the base side and toward the center of the plate 90 to terminate at the middle and obtuse angle corner and then extends along the second angular side back toward the base side terminating at the lower slot corner at the bottom of the base side.

The rearward end of the connecting member 92 extends through the cam slot 122 and the upper and lower acute angle corners thereof are rounded to be complementary in size to the diameter of the connecting member 92. The edges of the upper corner of the slot 122 receive the connecting member 22 when it is in the off-peak position shown in FIG. 3. The lower edges of the corner of the cam slot 122 receive the rearward end of the connecting member 92 when it is in the on-peak position shown in FIGS. 1, 4 and 5.

A generally horizontal slot 126 is formed in the control plate 90 to loosely receive the rearward end of the shaft 68 carrying the driven input gear of the demand gear train. A leaf spring 128 has one end fixed by a pin 130 to the plate 90 and extends downward to a free end which engages and biases the shaft 68 inwardly of the assembly 18 and toward the gear 82 at the right hand side thereof as viewed in FIGS. 3, 4 and 6.

The input gear 70 is moved away from the driving gear 82 by the action of the connecting member 92 being in the upper position within the cam slot 122 as shown in FIG. 3. As the plunger 96 is retracted upon energization, the connecting member 92 is shifted downwardly in the slot 126 to pivot the plate 90 counterclockwise so that the shaft 68 is moved inward and toward the driving gear 82. Meshing engagement between gears 70 and 82 is effected when the connecting member 92 is at the lower corner of the cam slot 122 as shown in FIGS. 4 and 6. If the teeth of gears 70 and 82 do not immediately mesh, engagement of the tops of the teeth cause the shaft 68 to be restrained to the left in the slot 126. The shaft is biased sidewardly in the inward direction by the resiliency of the spring 128. Relative movement between the gears 70 and 82 allows the teeth to move relative to each other so that they are forced into mesh by the spring 128 and the position of the plate due to the cooperative relationship of the connecting member 92 in the lower portion of the cam slot 122.

When the first control plate 88 is rotated in the rearwardly viewed clockwise direction, as indicated by the arrow 110 in FIG. 5, the rearward end of the connecting member 92 is raised in the cam slot 122 so as to pivot the control plate 90 in a clockwise direction. This forces the plate 90 from its second position to the first operative position. Thus, the second control plate 90 is moved concurrently with the first control plate 88 as it is moved from its second to the first operative position thereof upon de-energization of the solenoid actuator 94. Release of the plunger 96 permits the spring 97 to bias the plunger to its extended position shown in FIG. 3 and move plate 88 to its first position. It is now apparent that the connecting member 92 extends between the first and second control plates 88 and 90 so that they are concurrently moved between the respective first and second positions thereof to effect the off-peak and on-peak modes of operation, respectively, of the three sets of dials 34, 36 and 42. The further straight extension of the connecting member 92 through the dial plate 20 uniquely indicates a corresponding off-peak or on-peak condition of the dial.

The multi-dial register assembly 18 as described hereinabove effectively and efficiently provides three selectable intermediate gear driving paths between the register drive gearing 28 and the gear train input gears 58, 60 and 70. The first and second intermediate driving paths both include the output shaft 76, the driving output gear 80 and the first path includes input gear 58 and shaft 56 and the second path includes the input gear 60 and shaft 59. The third intermediate driving path includes the output shaft 78 and driving gear 82 and the input gear 70 and shaft 68 of the maximum demand gear train 61. The most clockwise position of the plate 88 and most clockwise position of the plate 90, as viewed in FIG. 3 provides the driving engagement with the input gear 58 through the first intermediate driving path. The most counterclockwise positions of the plate 88 and of the plate 90 provides the driving engagements of the input gears 60 and 70 through the second and third intermediate driving paths, as viewed in FIG. 4.

The multi-dial register assembly 18 including the parts of the gear shift mechanism 86 simply and compactly provides a combined on-peak watthour and maximum watt demand and off-peak watthour register which permits the use of standard watt demand and watthour meter register frame and parts. A multi-dial register as described hereinabove is detachably mounted to a watthour meter movement in a conventional manner identical to the mounting of other meter registers. Further, alternate modes of operation are easily provided by the multi-dial register assembly 18, for example, the position of the connecting member 92 may be fixedly locked by means of a removable screw in the upper and off-peak position within the slot 50 of the dial plate 20 to provide normal watthour register operation continuously. Alternatively, the connecting member 92 may be locked in the lower position within the dial plate slot 50 and continuously provide a combined watthour and maximum watt demand meter. The latter uses would not require the clock mechanism associated contacts 100. Further, the multi-dial register assembly may be simply operated as an on-peak and off-peak watthour register by shortening the rear portion of the connecting member 92, or by simple removal of either the second control plate 90 or the shaft 68 to de-activate the input to the maximum demand gear train portion of the register assembly 18.

It will be apparent to those skilled in the art that the preferred embodiment of the multi-dial register assembly 18 as described hereinabove may be modified and altered without departing from the spirit and scope of the invention as claimed herein.

What we claim is:

1. A multi-dial electric utility meter register assembly comprising:
   a frame for detachably mounting to a watthour meter movement;
   first, second and third gear trains mounted in said frame, each of said first, second and third gear trains having a separate input gear, and each of the gear trains having a separate set of plural dial pointer shafts for indicating totalized values of electrical power usage;
   a register drive gearing rotatable in response to measuring operation of said watthour meter movement;
   a first shifting control plate carried by said frame for shiftable movement between first and second positions for effecting alternate coupling of said register drive gearing to input gears of said first and second gear trains;
   a second shifting control plate carried by said frame for shiftable movement between first and second positions for effecting alternate coupling and uncoupling, respectively between said register drive gearing and said input gear of said third gear train; and
   a connecting member extending between said first and second control plates and movable so that both of said first and second control plates are concurrently moved between the respective first and second positions thereof with an outer end of said connecting member providing a dial status indicator for visually indicating the activated dial pointer shafts of the gear trains being drivingly connected to said meter movement; and
   an actuator means connected to one of said first and second control plates for moving the control plate connected thereto between said first and second positions thereof.

2. A multi-dial meter register assembly as claimed in claim 1 wherein said first, second and third gear trains include gear carrying shafts extending substantially parallel to each other, and wherein said first and second shifting control plates extend in substantially parallel planes to each other and transversely to said gear shafts, and further wherein said connecting member extends substantially parallel to said shafts.

3. A multi-dial meter register assembly as claimed in claim 2 wherein said actuator means includes a reciprocally movable plunger connected to one end of said first shifting control plate, and wherein said connecting means is mounted to the second end of the first control plate.

4. A multi-dial meter register assembly as claimed in claim 3 wherein said second control plate includes a cam slot receiving a rearward end of said connecting member and wherein a forward end of said connecting member carries a flag designator.

5. A multi-dial meter register assembly as claimed in claim 3 wherein said register drive gearing includes one driving gear rotationally mounted on said first control plate for movement into alternate engagement with said input gears of said first and second gear trains, and wherein said register drive gearing includes a second driving gear rotatable about a fixed axis, and still further wherein said input gear of said third gear train is carried by said second control plate for movement into engagement and disengagement with said second driving gear.

6. A multi-dial meter register assembly as claimed in claim 5 wherein said actuator means includes a solenoid effecting the reciprocal movement of said plunger and wherein said solenoid is energizable during predetermined daily time periods.

7. A multi-dial meter register assembly as claimed in claim 6 wherein said actuator means includes a biasing means for positioning said plunger in one extreme of the reciprocal movement to maintain said first shifting control plate in the first position thereof when said actuator is de-energized.

8. A multi-dial meter register assembly as claimed in claim 4 wherein said second shifting control plate includes a slot extending transversely to the shafts carrying the gears of the assembly gear trains, and wherein the transverse slot receives a shaft carrying said input gear of said third gear train, and further wherein said second shifting control plate includes a spring biasing means for urging said shaft in the transverse slot towards said second driving gear.

9. A multi-dial electric utility meter register assembly for selectively indicating electric power usage during on-peak and off-peak billing conditions, said multi-dial meter register assembly comprising:

a frame for detachably mounting to a watthour movement producing metering rotations at a rate responsive to the consumption of electric energy at a load;

first and second watthour dial gear trains mounted in said frame, each of said first and second gear trains having a driven input gear driving plural pointer shafts of the respective dial gear trains so as to indicate at associated first and second watthour dials the accumulated values of electric energy consumption;

a register drive gearing rotationally connected to the metering rotations of said watthour meter movement and including two output shafts separately carrying one driving gear and a second driving gear respectively;

a first control plate pivotally carried on said frame rearwardly of said first and second watthour dial meter trains for shiftable movement between first and second positions with said first control plate carrying said output shaft having said one driving gear thereon, said first and second positions of the first control plate alternately coupling said one driving gear to said input gears of said first and said second dial gear trains, respectively;

a maximum demand gear train including a maximum demand dial indicating gear train and an input gear, the dial indicating gear train having plural pointer shafts for indicating the maximum demand of electric power usage at associated maximum watt demand dials;

a second control plate pivotally carried by said frame rearwardly of said first control plate for shifting movement between first and second positions, said second control plate carrying the other of the two output shafts having said second driving gear thereon such that said first and second positions of the second control plate are effective to alternately uncouple and couple said input gear of said demand gear train with said second driving gear;

a straight connecting member carried on one end of said first control plate and extending rearwardly to engage said second control plate, said connecting member further extending forward to terminate at a dial status indicator adjacent the dials of said first and second watthour dials and said maximum watt demand dials, said connecting member being movable by said first control plate so as to concurrently move said second control plate whereby said first and second positions of said first and second control plates are effected concurrently; and a solenoid actuator having a reciprocally movable plunger connected to another end of said first control plate remotely of said one end carrying said connecting member so that an extended reciprocal position of said plunger moves said first control plate to said first position and further so that a retracted plunger position moves said first control plate to said second position thereof.

10. A multi-dial meter register assembly as claimed in claim 9 wherein said first and second control plates are rotated in common directions when moving concurrently between said first and second positions of each plate.

11. A multi-dial meter register assembly as claimed in claim 9 wherein said second watthour dial and said maximum watt demand dial produce on-peak electric power usage indications and said first watthour dial produces off-peak electric power usage indications.

12. A multi-dial meter register assembly as claimed in claim 11 wherein said solenoid actuator includes means for connecting said solenoid actuator, a clock controlled switch means for energizing and de-energizing said solenoid actuator during said on-peak and off-peak billing conditions, respectively.

* * * * *